US012813303B2

(12) United States Patent
Ruan et al.

(10) Patent No.: US 12,813,303 B2
(45) Date of Patent: Nov. 24, 2026

(54) DISPLAY DEVICE HAVING TRANSPARENT ELECTRODE LAYERS WITH DIFFERENT GRAIN SIZES

(71) Applicant: AUO Corporation, Hsinchu City (TW)

(72) Inventors: Cheng-He Ruan, Hsinchu City (TW); Jen-Hao Shih, Hsinchu City (TW); Min-Zi Hong, Hsinchu City (TW); Chun-Lung Huang, Hsinchu City (TW)

(73) Assignee: AUO CORPORATION, Hsinchu City (TW)

( * ) Notice: Subject to any disclaimer, the term of this patent is extended or adjusted under 35 U.S.C. 154(b) by 174 days.

(21) Appl. No.: 18/916,772

(22) Filed: Oct. 16, 2024

(65) Prior Publication Data

US 2025/0167095 A1 May 22, 2025

(30) Foreign Application Priority Data

Nov. 21, 2023 (TW) ................................ 112145013

(51) Int. Cl.
*H10W 70/65* (2026.01)
*G02F 1/1343* (2006.01)
(Continued)

(52) U.S. Cl.
CPC ........ *H10W 70/65* (2026.01); *G02F 1/13439* (2013.01); *G02F 1/155* (2013.01); (Continued)

(58) Field of Classification Search
CPC ............................. G02F 1/155; G02F 1/13439
See application file for complete search history.

(56) References Cited

U.S. PATENT DOCUMENTS

2014/0177026 A1 6/2014 Tsai et al.
2022/0113598 A1* 4/2022 Ito ..................... G02F 1/134309

FOREIGN PATENT DOCUMENTS

CN 214474330 U 10/2021
CN 218181283 U 12/2022
(Continued)

OTHER PUBLICATIONS

Seung Jin Oh et al., Unveiling the Annealing-Dependent Mechanical Properties of Freestanding Indium Tin Oxide Thin Films, ACS Appl. Mater. Interfaces 2021, 13, 16650~16659, https://doi.org/10.1021/acsami. 0c23112 (ref01, file attached).

*Primary Examiner* — Lauren Nguyen
(74) *Attorney, Agent, or Firm* — WPAT, PC

(57) ABSTRACT

A display device includes a display panel and a switch panel. The display panel has a display surface and a bottom surface, where the bottom surface is located between the display surface and the switch panel. The switch panel includes a first substrate, a first transparent electrode layer, a first metal pattern layer, a first transparent conductive pattern layer, a second substrate, and a display medium disposed between the first substrate and the second substrate. The first transparent electrode layer is disposed on the first substrate and has a first grain size. The first metal pattern layer is disposed on the first transparent electrode layer and includes first openings exposing the first transparent electrode layer. The first transparent conductive pattern layer covers the first metal pattern layer and includes second openings exposing the first transparent electrode layer, and has a second grain size less than the first grain size.

20 Claims, 7 Drawing Sheets

(51) Int. Cl.

| | |
|---|---|
| ***G02F 1/155*** | (2006.01) |
| ***H10K 59/131*** | (2023.01) |
| ***H10W 70/66*** | (2026.01) |
| ***H10W 90/00*** | (2026.01) |

(52) U.S. Cl.

CPC .......... *H10W 70/66* (2026.01); *H10K 59/131* (2023.02); *H10W 90/00* (2026.01)

(56) References Cited

FOREIGN PATENT DOCUMENTS

| | | | |
|---|---|---|---|
| TW | 201741731 | A | 12/2017 |
| TW | 1855884 | B | 9/2024 |

* cited by examiner

DISPLAY DEVICE HAVING TRANSPARENT ELECTRODE LAYERS WITH DIFFERENT GRAIN SIZES

CROSS-REFERENCE TO RELATED APPLICATION

This application claims priority to Taiwan Application Serial Number 112145013, filed Nov. 21, 2023, which is herein incorporated by reference in its entirety.

BACKGROUND

Field of Invention

The present disclosure relates to a display device. More particularly, the present disclosure relates to a display device including a switch panel disposed under a display panel.

Description of Related Art

With the development of information technology, the demand for display devices that display images has also increased in various forms. Recently, research on transparent display devices is being actively carried out. One of the transparent display devices may include a transparent display panel with a certain degree of transparency and a switch panel disposed behind the transparent display panel. When the switch panel is in the light transmitting mode, the user can see the image information displayed on the transparent display panel, and can see the background information behind the transparent display panel; when the switch panel is in the opaque mode, the user can only see the image information displayed on the transparent display panel, but cannot see the background information behind the transparent display panel. Therefore, the transmittance of the light transmitting mode of the switch panel and the switching speed between the light transmitting mode and the opaque mode affect the display quality of the display device.

SUMMARY

At least one embodiment of the present disclosure provides a display device including a switch panel disposed under a display panel. The switch panel includes a transparent electrode layer, a metal pattern layer and a transparent conductive pattern layer sequentially disposed on a substrate. The grain size of the transparent conductive pattern layer is less than the grain size of the transparent electrode layer, and the metal pattern layer and the transparent conductive pattern layer include openings to expose the transparent electrode layer. By setting the metal pattern layer and the transparent conductive pattern layer, the resistance is reduced to increase the switching speed between the light transmitting mode and the opaque mode, and the metal pattern layer and the transparent conductive pattern layer including openings to expose the transparent electrode layer can maintain or increase the transmittance of the light transmitting mode, thereby improving the display quality of the display device.

The display device according to at least one embodiment of the present disclosure includes a display panel and a switch panel. The display panel has a display surface and a bottom surface opposite to the display surface, where the bottom surface is located between the display surface and the switch panel. The switch panel includes a first substrate, a first transparent electrode layer, a first metal pattern layer, a first transparent conductive pattern layer, a second substrate, and a display medium disposed between the first substrate and the second substrate. The first transparent electrode layer is disposed on the first substrate and has a first grain size. The first metal pattern layer is disposed on the first transparent electrode layer and includes multiple first openings exposing the first transparent electrode layer. The first transparent conductive pattern layer covers the first metal pattern layer and includes multiple second openings exposing the first transparent electrode layer, and the first transparent conductive pattern layer has a second grain size less than the first grain size.

The display device according to at least another embodiment of the present disclosure includes a transparent display panel and a switch panel. The transparent display panel has a display surface and a bottom surface opposite to the display surface, where the bottom surface is located between the display surface and the switch panel. The switch panel includes a first substrate, a first transparent electrode layer, a first metal pattern layer, a first transparent conductive pattern layer, a second substrate, and a display medium disposed between the first substrate and the second substrate. The first transparent electrode layer is disposed on the first substrate and has a first grain size. The first metal pattern layer is disposed on the first transparent electrode layer and includes multiple first openings exposing the first transparent electrode layer. The first transparent conductive pattern layer covers the first metal pattern layer and includes multiple second openings exposing the first transparent electrode layer, and the first transparent conductive pattern layer has a second grain size less than the first grain size.

DETAILED DESCRIPTION

Figure 1:
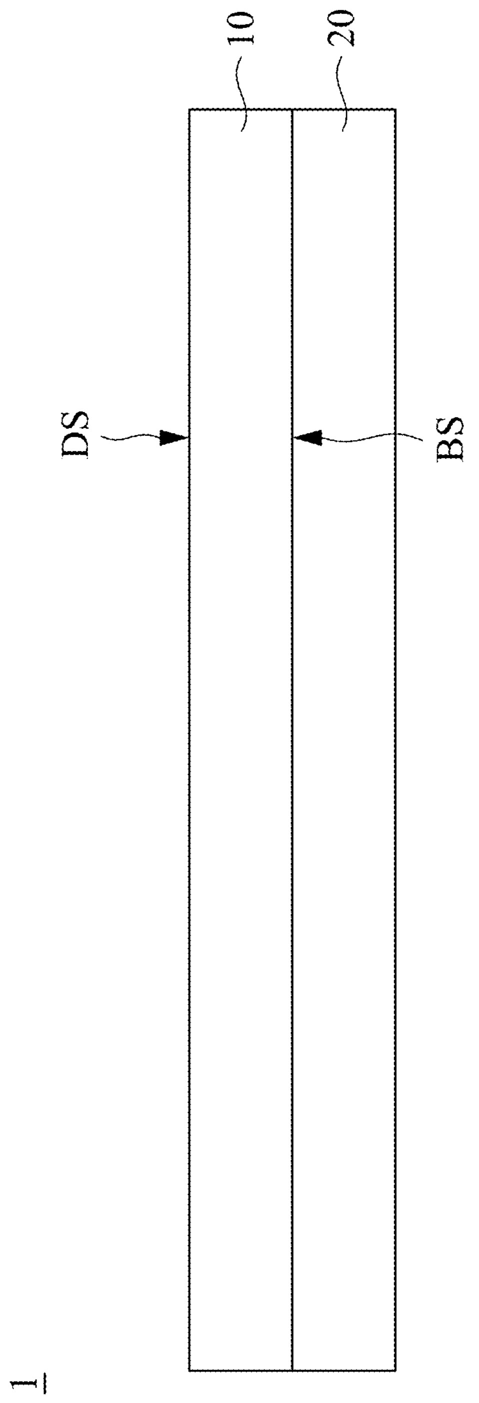
FIG. 1 is a schematic cross-sectional view of a display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

In addition, "about" may mean within one or more standard deviations of the above values, such as within ±30%, ±20%, ±10%, or ±5%. Such words as "about", "approximately", or "substantially" as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as "below," "under," "above," "on," and the like, are intended to facilitate the recitation of a relative relationship between one element or feature and another as depicted in the drawings. The true meaning of these spatial relative terms includes other orientations. For example, the relationship between one element and another may change from "below" and "under" to "above" and "on" when the drawing is turned 180 degrees up or down. In addition, spatially relative descriptions used in the present disclosure should be interpreted in the same manner.

It should be understood that while the present disclosure may use terms such as "first", "second", "third" to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

Figure 2:
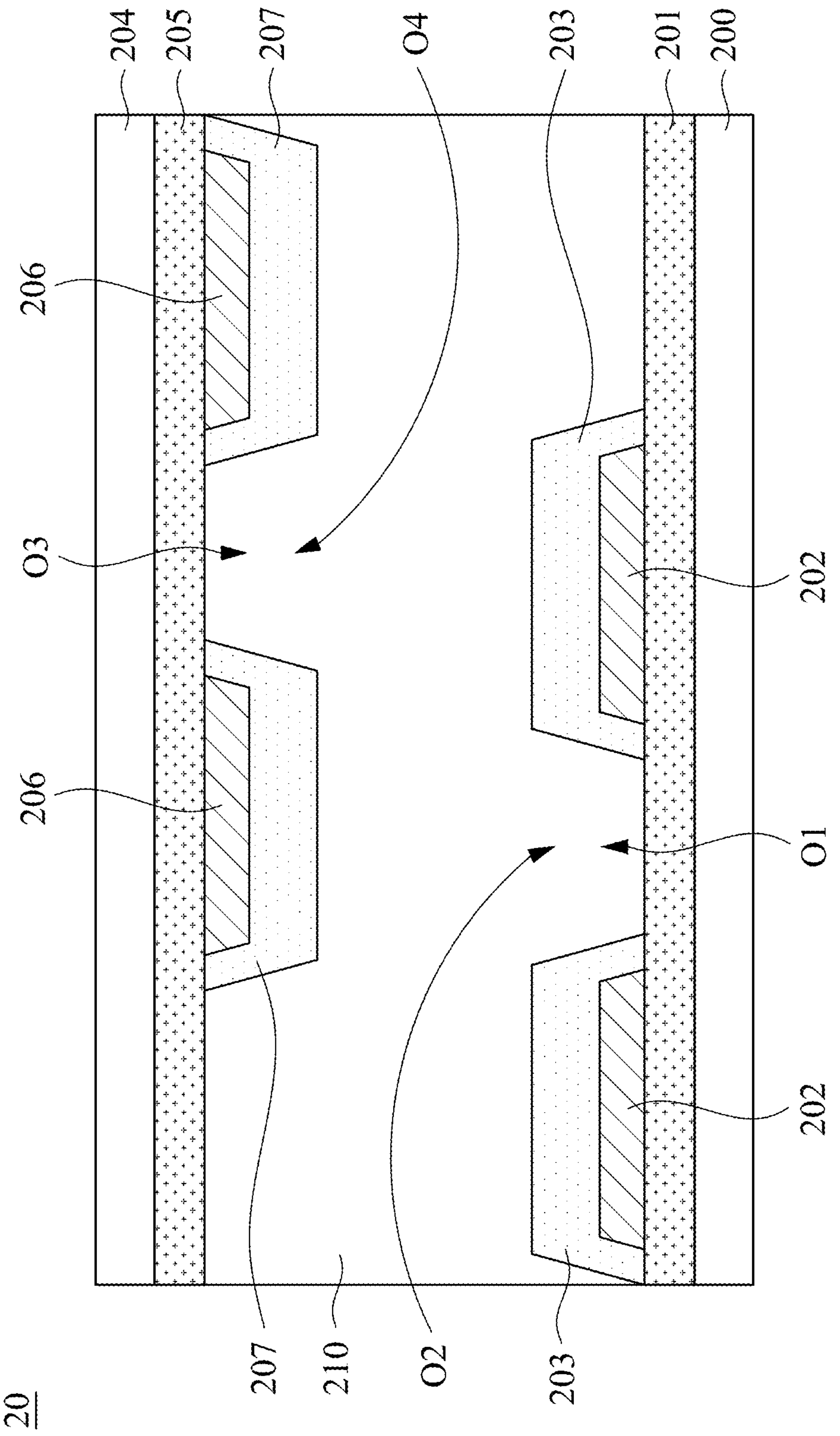
FIG. 2 is a partial schematic cross-sectional view of a switch panel according to at least one embodiment of the present disclosure.

FIG. 1 is a schematic cross-sectional view of a display device 1 according to at least one embodiment of the present disclosure. FIG. 2 is a partial schematic cross-sectional view of a switch panel 20 according to at least one embodiment of the present disclosure. Referring to FIG. 1, the display device 1 includes a display panel 10 and a switch panel 20. The display panel 10 has a display surface DS and a bottom surface BS opposite to the display surface DS. The display surface DS is the surface of the display panel 10 that faces the user to display images, and the bottom surface BS is located between the display surface DS and the switch panel 20. Referring to FIG. 2, the switch panel 20 includes a first substrate 200, a first transparent electrode layer 201, a first metal pattern layer 202, a first transparent conductive pattern layer 203, a second substrate 204, and a display medium 210 disposed between the first substrate 200 and the second substrates 204. The first transparent electrode layer 201 is disposed on the first substrate 200 and has a first grain size. The first metal pattern layer 202 is disposed on the first transparent electrode layer 201 and includes multiple first openings O1 exposing the first transparent electrode layer 201. The first transparent conductive pattern layer 203 covers the first metal pattern layer 202 and includes multiple second openings O2 exposing the first transparent electrode layer 201, and the first transparent conductive pattern layer 203 has a second grain size less than the first grain size.

By disposing the switch panel 20 under the display panel 10 and being independent of the display panel 10, the light transmitting mode and the opaque mode can be easily switched. Furthermore, by setting the first transparent electrode layer 201 with a larger grain size, and the first transparent electrode layer 201 being exposed by the first openings O1 of the first metal pattern layer 202 and the second openings O2 of the first transparent conductive pattern layer 203, the transmittance of the light transmitting mode can be maintained or increased, and by setting the first metal pattern layer 202 and the first transparent conductive pattern layer 203 with a smaller grain size, the resistance is reduced to increase the switching speed between the light transmitting mode and the opaque mode, thereby improving the display quality of the display device 1.

Referring to FIG. 2, the switch panel 20 further includes a second transparent electrode layer 205, a second metal pattern layer 206 and a second transparent conductive pattern layer 207. The second transparent electrode layer 205 is disposed on the second substrate 204 and has a third grain size. The second metal pattern layer 206 is disposed on the second transparent electrode layer 205 and includes multiple third openings O3 exposing the second transparent electrode layer 205. The second transparent conductive pattern layer 207 covers the second metal pattern layer 206 and includes multiple fourth openings O4 exposing the second transparent electrode layer 205, and the second transparent conductive pattern layer 207 has a fourth grain size less than the third grain size.

As shown in FIG. 2, in the normal line of the first substrate 200, a portion of the first metal pattern layer 202 does not overlap with the second metal pattern layer 206. Through the aforementioned design, compared to the first metal pattern layer 202 completely overlapping with the second metal pattern layer 206, the display unevenness of the switch panel 20 can be reduced, thereby improving the display quality of the display device 1. Furthermore, the first transparent conductive pattern layer 203 covers the upper surface and the side surface of the first metal pattern layer 202, and the second transparent conductive pattern layer 207 covers the upper surface and the side surface of the second metal pattern layer 206. Through the aforementioned design, the first metal pattern layer 202 and the second metal pattern layer 206 can be avoided from being exposed to the outside, where metal diffusion or serious oxidation may occur, resulting in abnormal resistance and affecting the display quality.

In some embodiments, the first grain size and the third grain size are both in a range from 45 nm to 55 nm, and the second grain size and the fourth grain size are both in a range from 30 nm to 40 nm. In some embodiments, the transmittance of the first transparent electrode layer 201 and the transmittance of the second transparent electrode layer 205 are greater than the transmittance of the first transparent conductive pattern layer 203 and the transmittance of the second transparent conductive pattern layer 207, respectively. The sheet resistance of the first transparent conductive pattern layer 203 and the sheet resistance of the second transparent conductive pattern layer 207 are less than the sheet resistance of the first transparent electrode layer 201 and the sheet resistance of the second transparent electrode layer 205, respectively. For example, the transmittance of the first transparent electrode layer 201 and the transmittance of the second transparent electrode layer 205 are both greater than 95%, and the transmittance of the first transparent conductive pattern layer 203 and the transmittance of the second transparent conductive pattern layer 207 are both less than 95%, e.g., the transmittance of the first transparent electrode layer 201 and the transmittance of the second transparent electrode layer 205 are both in a range from 95.5% and 99.9%, and the transmittance of the first transparent conductive pattern layer 203 and the transmittance of the second transparent conductive pattern layer 207 are both in a range from 88.5% to 94.5%. The sheet resistance of the first transparent conductive pattern layer 203 and the sheet resistance of the second transparent conductive pattern layer 207 are both less than 25Ω/□, and the sheet resistance of the first transparent electrode layer 201 and the sheet resistance of the second transparent electrode layer 205 are both greater than 25Ω/□, e.g., the sheet resistance of the first transparent conductive pattern layer 203 and the sheet resistance of the second transparent conductive pattern layer 207 are both in a range from 10.5Ω/□ to 24.5Ω/□, and the sheet resistance of the first transparent electrode layer 201 and the sheet resistance of the second transparent electrode layer 205 are both in a range from 25.5Ω/□ to 40.5Ω/□. By designing the relationship and range of the aforementioned characteristic values, the resistance can be reduced to increase the switching speed between the light transmitting mode and the opaque mode, and the transmittance of the light transmitting mode can be maintained or increased, thereby improving the display quality of the display device.

In some embodiments, the display panel 10 may be a self-luminous display panel, such as a micro light emitting diode (micro LED, μLED) panel or an organic light emitting diode (OLED) panel. In addition, the display panel 10 may be a transparent display panel, taking the micro LED panel as an example, the micro LED is located in the pixel area near the wiring, so the pixel area not only has the area for the micro LED, but also has the light transmitting area that is not covered by the micro LED, which in turn allows the micro LED panel to be used as the transparent display panel.

In some embodiments, the materials of the first substrate 200 and the second substrate 204 may include quartz, glass, polymer, and/or other suitable materials. The materials of the first transparent electrode layer 201, the second transparent electrode layer 205, the first transparent conductive pattern layer 203, and the second transparent conductive pattern layer 207 may include indium tin oxide (ITO), indium zinc oxide (IZO), aluminum tin oxide (ATO), aluminum zinc oxide (AZO), indium germanium zinc oxide (IGZO), or other suitable materials. The materials of the first metal pattern layer 202 and the second metal pattern layer 206 may include a metal with good electrical conductivity, such as aluminum, molybdenum, titanium, copper, silver, and other metals. In addition, the display medium 210 may include a suspended particle layer, a polymer dispersed liquid crystal layer, or an electrochromic material layer. For example, the materials of the first transparent electrode layer 201, the second transparent electrode layer 205, the first transparent conductive pattern layer 203, and the second transparent conductive pattern layer 207 include indium tin oxide, the materials of the first metal pattern layer 202 and the second metal pattern layer 206 include aluminum, and the display medium 210 include an electrochromic material layer. In some embodiments, the first transparent electrode layer 201, the second transparent electrode layer 205, the first metal pattern layer 202, the second metal pattern layer 206, the first transparent conductive pattern layer 203, and the second transparent conductive pattern layer 207 may be formed by a deposition process, a printing process, a photolithography process, an etching process, or other suitable process.

In some embodiments, the annealing temperature of the first transparent electrode layer 201 and the annealing temperature of the second transparent electrode layer 205 are greater than the annealing temperature of the first transparent conductive pattern layer 203 and the annealing temperature of the second transparent conductive pattern layer 207, respectively. For example, the annealing temperature of the first transparent electrode layer 201 and the annealing temperature of the second transparent electrode layer 205 are both greater than 400 °C, the annealing temperature of the first transparent conductive pattern layer 203 and the annealing temperature of the second transparent conductive pattern layer 207 are both less than 300 °C, e.g., the annealing temperature of the first transparent electrode layer 201 and the annealing temperature of the second transparent electrode layer 205 are both in a range from 420 °C to 480 °C, and the annealing temperature of the first transparent conductive pattern layer 203 and the annealing temperature of the second transparent conductive pattern layer 207 are both in a range from 200 °C to 260 °C. By the aforementioned relationship and value design of the annealing temperature, the first transparent electrode layer 201 and the second transparent electrode layer 205 can have larger grain sizes and higher transmittances than the first transparent conductive pattern layer 203 and the second transparent conductive pattern layer 207, respectively, and the first transparent conductive pattern layer 203 and the second transparent conductive pattern layer 207 can have lower sheet resistances than the first transparent electrode layer 201 and the second transparent electrode layer 205, respectively. Furthermore, by annealing the first transparent conductive pattern layer 203 and the second transparent conductive pattern layer 207 formed on the first metal pattern layer 202 and the second metal pattern layer 206 at a relatively low temperature, the first metal pattern layer 202 and the second metal pattern layer 206 can be prevented from being severely oxidized to cause abnormal resistance and affect display quality.

Figure 3A:
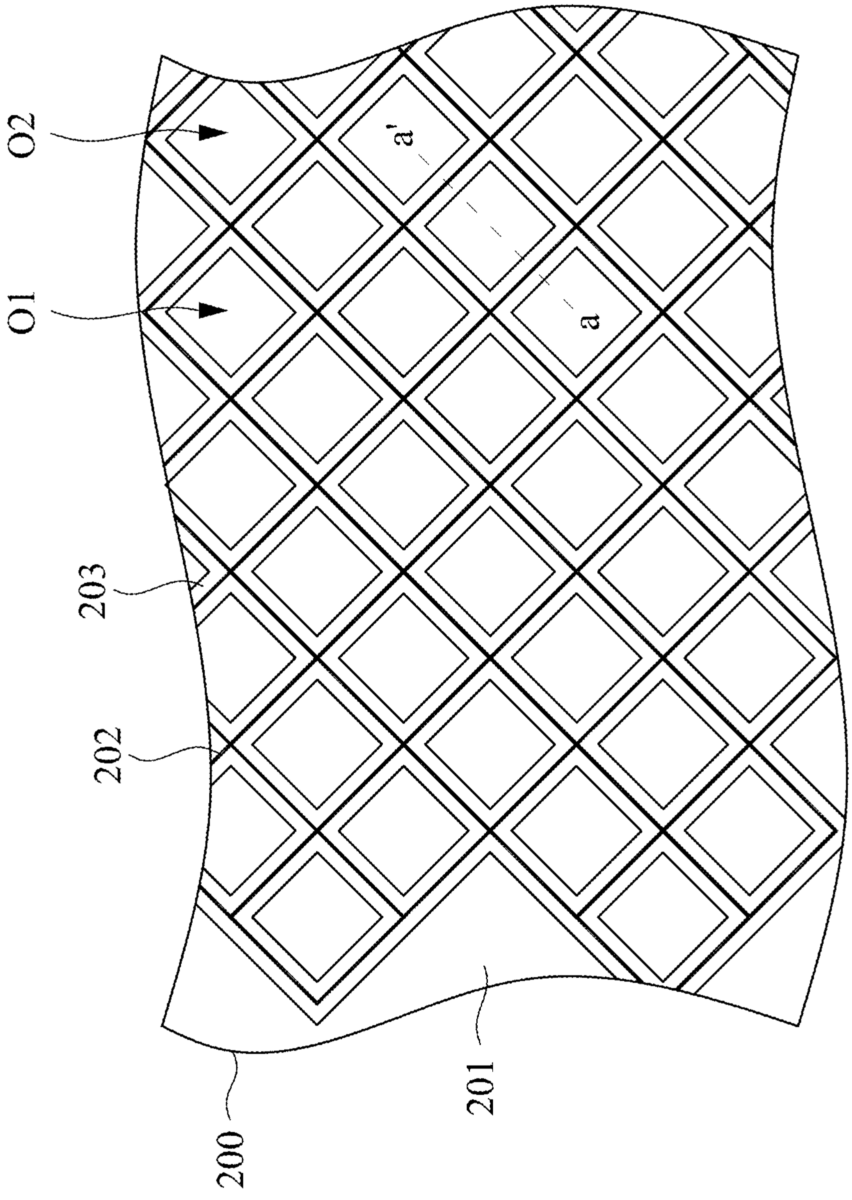
FIG. 3A is a partial schematic top view of a first substrate, a first transparent electrode layer, a first metal pattern layer, and a first transparent conductive pattern layer according to at least one embodiment of the present disclosure.
Figure 3B:
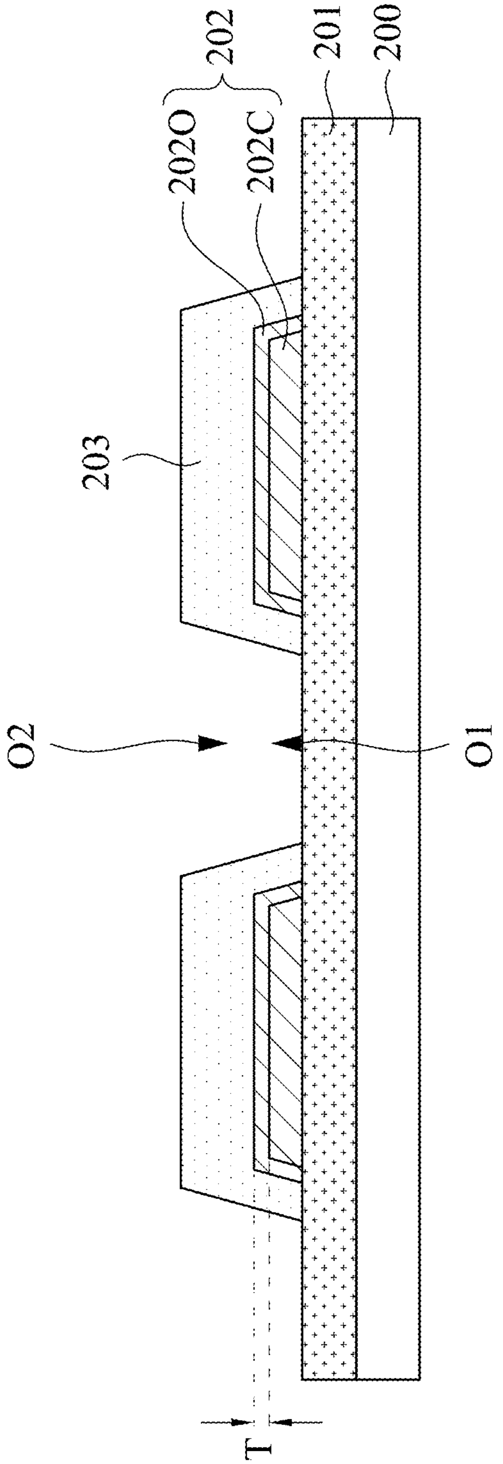
FIG. 3B is a schematic cross-sectional view taken along line a-a' of FIG. 3A.

FIG. 3A is a partial schematic top view of a first substrate 200, a first transparent electrode layer 201, a first metal pattern layer 202, and a first transparent conductive pattern layer 203 according to at least one embodiment of the present disclosure. FIG. 3B is a schematic cross-sectional view taken along line a-a' of FIG. 3A. Since the structures, the materials, and the relative positions of the second substrate 204, the second transparent electrode layer 205, the second metal pattern layer 206, and the second transparent conductive pattern layer 207 are substantially the same as that of the first substrate 200, the first transparent electrode layer 201, the first metal pattern layer 202, and the first transparent conductive pattern layer 203. Therefore, the first substrate 200, the first transparent electrode layer 201, the first metal pattern layer 202, and the first transparent conductive pattern layer 203 of FIGS. 3A and 3B are illustrated for example, and the second substrate 204, the second transparent electrode layer 205, the second metal pattern layer 206, and the second transparent conductive pattern layer 207 are illustrated in text without additional drawing.

Referring to FIG. 3A and FIG. 3B, the first transparent electrode layer 201 is continuously formed on the first substrate 200. The first metal pattern layer 202 is continuously formed on the first transparent electrode layer 201, and includes the first openings O1 exposing the first transparent electrode layer 201. The first transparent conductive pattern layer 203 is continuously formed on the first metal pattern layer 202, and includes the second openings O2 exposing the first transparent electrode layer 201. That is, the top view patterns of the first metal pattern layer 202 and the first transparent conductive pattern layer 203 are grid patterns, respectively. In this embodiment, the shapes of the grid patterns of the first metal pattern layer 202 and the first transparent conductive pattern layer 203 are square, but are not limited thereto. In other embodiments, the shapes of the grid patterns of the first metal pattern layer 202 and the first transparent conductive pattern layer 203 may be other types of parallelograms, circle, ellipse, triangle or other appropriate shapes, and the shapes of the grid patterns of the first metal pattern layer 202 and the first transparent conductive pattern layer 203 may be the same or different.

Similarly, the second transparent electrode layer 205 is continuously formed on the second substrate 204. The second metal pattern layer 206 is continuously formed on the second transparent electrode layer 205, and includes the third openings O3 exposing the second transparent electrode layer 205. The second transparent conductive pattern layer 207 is continuously formed on the second metal pattern layer 206, and includes the fourth openings O4 exposing the second transparent electrode layer 205. That is, the top view patterns of the second metal pattern layer 206 and the second transparent conductive pattern layer 207 are grid patterns, respectively. The shapes of the grid patterns of the second metal pattern layer 206 and the second transparent conductive pattern layer 207 may be parallelogram, circle, ellipse, triangle or other appropriate shapes, and the shapes of the grid patterns of the second metal pattern layer 206 and the second transparent conductive pattern layer 207 may be the same or different. In addition, the shapes of the grid patterns of the first metal pattern layer 202, the first transparent conductive pattern layer 203, the second metal pattern layer 206, and the second transparent conductive pattern layer 207 may be the same or different.

As shown in FIG. 3A, the orthographic projection of the first metal pattern layer 202 on the first substrate 200 is located within the orthographic projection of the first transparent conductive pattern layer 203 on the first substrate 200. In addition, the orthographic projection of the second opening O2 of the first transparent conductive pattern layer 203 on the first substrate 200 is located within the orthographic projection of the first opening O1 of the first metal pattern layer 202 on the first substrate 200. Through the aforementioned design, it can be ensured that the first transparent conductive pattern layer 203 completely covers the first metal pattern layer 202, so as to avoid that the first metal pattern layer 202 is exposed to the outside, where metal diffusion or serious oxidation may occur, resulting in abnormal resistance and affecting the display quality.

Similarly, the orthographic projection of the second metal pattern layer 206 on the second substrate 204 is located within the orthographic projection of the second transparent conductive pattern layer 207 on the second substrate 204. In addition, the orthographic projection of the fourth opening O4 of the second transparent conductive pattern layer 207 on the second substrate 204 is located within the orthographic projection of the third opening O3 of the second metal pattern layer 206 on the second substrate 204.

Referring to FIG. 3B, in the normal line of the first substrate 200, the first openings O1 of the first metal pattern layer 202 overlap with the second openings O2 of the first transparent conductive pattern layer 203, respectively. Similarly, in the normal line of the second substrate 204, the third openings O3 of the second metal pattern layer 206 overlap with the fourth openings O4 of the second transparent conductive pattern layer 207, respectively.

As shown in FIG. 3B, the first metal pattern layer 202 includes a first oxide layer 202O in contact with the first transparent conductive pattern layer 203 and a first conductive layer 202C located between the first transparent electrode layer 201 and the first oxide layer 202O. The thickness T of the first oxide layer 202O is less than 5 nm. Since the first transparent conductive pattern layer 203 with a relatively low annealing temperature (e.g., less than 300 °C) is used to cover the first metal pattern layer 202, compared with using a transparent conductive layer with a relatively high annealing temperature (e.g., greater than 400 °C), the thickness of the first oxide layer 202O of the first metal pattern layer 202 in contact with the first transparent conductive pattern layer 203 can be effectively reduced to prevent the first metal pattern layer 202 from having an overly thick oxide layer due to the annealing process of the first transparent conductive pattern layer 203, which causes the resistance to increase, thereby reducing the switching speed between the light transmitting mode and the opaque mode and affecting the display quality of the display device 1.

Similarly, the second metal pattern layer 206 includes a second oxide layer in contact with the second transparent conductive pattern layer 207 and a second conductive layer located between the second transparent electrode layer 205 and the second oxide layer. The thickness of the second oxide layer is less than 5 nm.

Figure 4A:
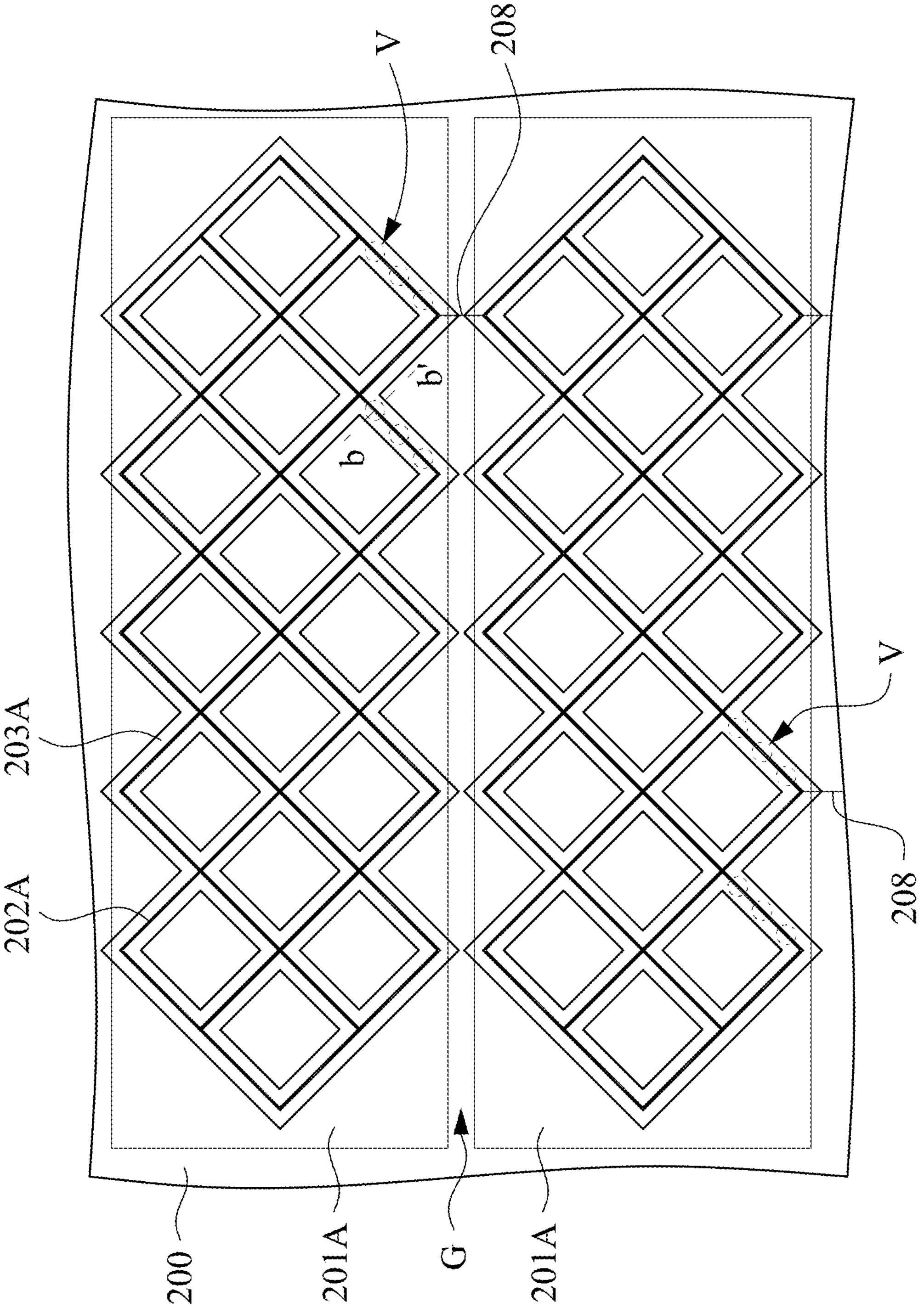
FIG. 4A is a partial schematic top view of a first substrate, a first wiring layer, a first transparent electrode layer, a first metal pattern layer, and a first transparent conductive pattern layer according to at least another embodiment of the present disclosure.
Figure 4B:
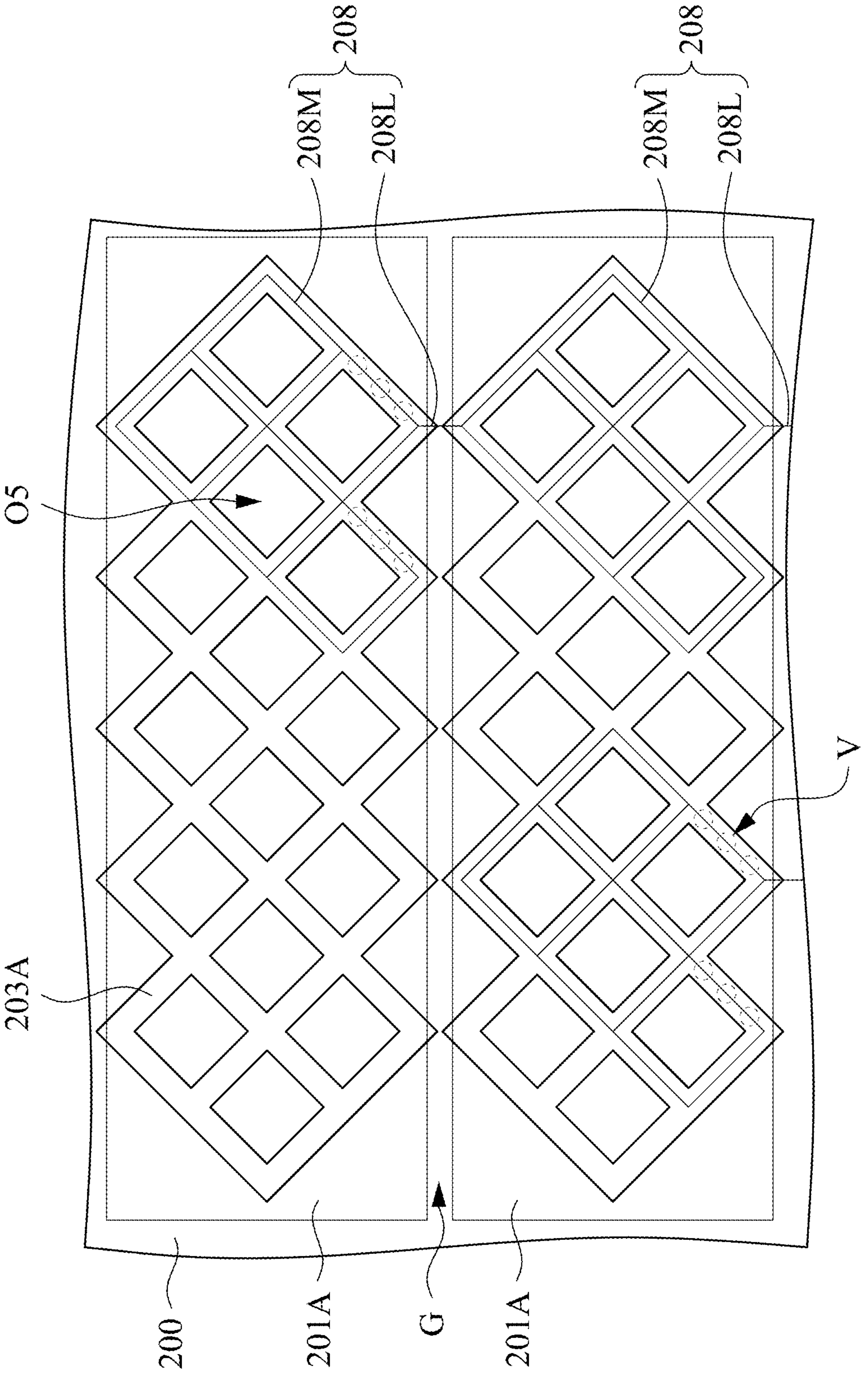
FIG. 4B is a partial schematic top view of a first substrate, a first wiring layer, a first transparent electrode layer, and a first transparent conductive pattern layer according to at least another embodiment of the present disclosure.
Figure 4C:
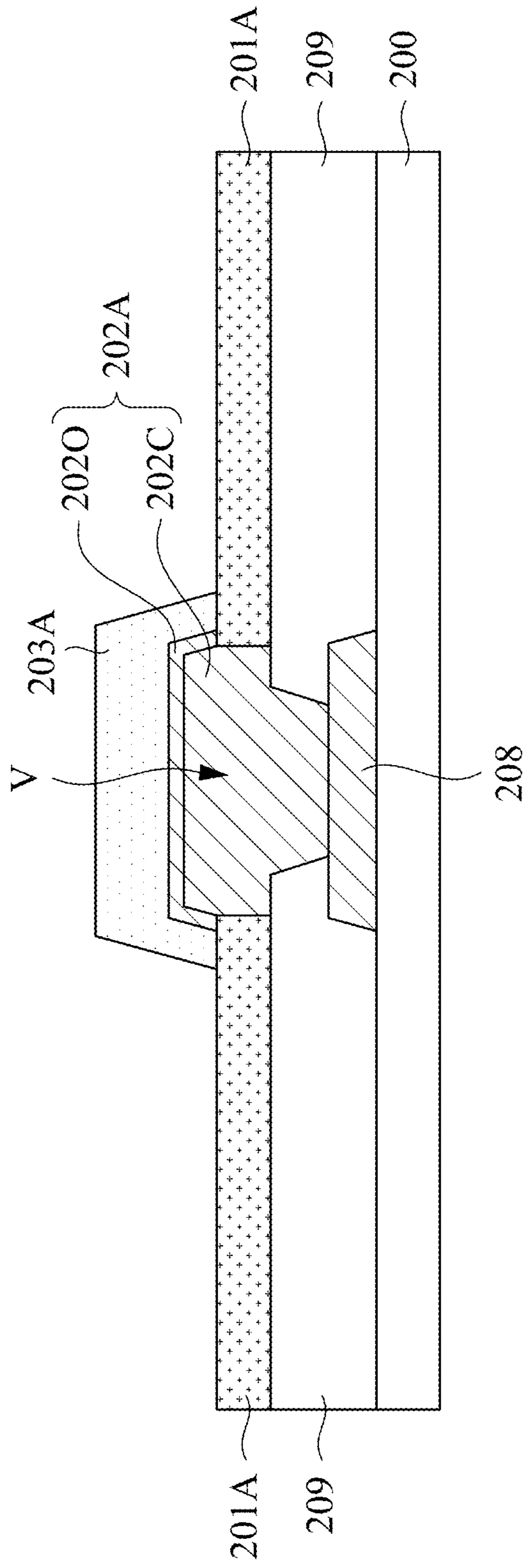
FIG. 4C is a schematic cross-sectional view taken along line b-b' of FIG. 4A.

FIG. 4A is a partial schematic top view of a first substrate 200, a first wiring layer 208, a first transparent electrode layer 201A, a first metal pattern layer 202A, and a first transparent conductive pattern layer 203A according to at least another embodiment of the present disclosure. FIG. 4B is a partial schematic top view of a first substrate 200, a first wiring layer 208, a first transparent electrode layer 201A, and a first transparent conductive pattern layer 203A according to at least another embodiment of the present disclosure. FIG. 4C is a schematic cross-sectional view taken along line b-b' of FIG. 4A. The structures, the materials, the manufacturing processes and the relative positions of most elements in the embodiment of FIGS. 4A to 4C and the embodiment of FIGS. 3A to 3B are the same, so the same features are not repeated here. The difference between the embodiment of FIGS. 4A to 4C and the embodiment of FIGS. 3A to 3B is that the first transparent electrode layer 201A includes multiple transparent electrodes separated from each other, and the first metal pattern layer 202A and the first transparent conductive pattern layer 203A include multiple grid patterns separated from each other, and the embodiment of FIGS. 4A to 4C further include a first wiring layer 208 disposed on the first substrate 200 and a first insulating layer 209 disposed on the first wiring layer 208. Therefore, the light transmitting mode and the opaque mode of the embodiment of FIGS. 3A to 3B are whole switched, and the light transmitting mode and the opaque mode of the embodiment of FIGS. 4A to 4C can be switched by region.

Referring to FIG. 4A and FIG. 4B, there is a gap G between two first transparent electrode layers 201A separated from each other, two first metal pattern layers 202A separated from each other correspond to the two first transparent electrode layers 201A, respectively, and two first transparent conductive pattern layers 203A separated from each other correspond to the two first transparent electrode layers 201A, respectively. The first wiring layer 208 is disposed on the first substrate 200 and includes a grid part 208M and a connection part 208L connecting the grid part 208M. As shown in FIG. 4B, the connection part 208L crosses the gap G to connect two grid parts 208M on two sides of the gap G, and the grid part 208M includes multiple fifth openings O5 exposing the first transparent electrode layer 201A, that is, the top view pattern of the grid part 208M is a grid pattern. In this embodiment, the shape of the grid pattern of the grid part 208M is a square, but is not limited thereto. In other embodiments, the shape of the grid pattern of the grid part 208M may be other types of parallelograms, circle, ellipse, triangle, or other appropriate shapes.

Similarly, the second transparent electrode layer 205 may include multiple transparent electrodes separated from each other, and the second metal pattern layer 206 and the second transparent conductive pattern layer 207 may include multiple grid patterns separated from each other, and this embodiment may further include a second wiring layer disposed on the second substrate 204 and a second insulating layer disposed on the second wiring layer. The second wiring layer may include a grid part and a connection part connecting the grid part, where the grid part includes multiple sixth openings exposing the second transparent electrode layer 205, that is, the top view pattern of the grid part is a grid pattern. In this embodiment, the shape of the grid pattern of the grid part is a square, but is not limited thereto. In other embodiments, the shape of the grid pattern of the grid part may be other types of parallelograms, circle, ellipse, triangle, or other appropriate shapes.

As shown in FIG. 4A and FIG. 4B, the orthographic projection of the grid part 208M of the first wiring layer 208 on the first substrate 200 is located within the orthographic projection of the first metal pattern layer 202A on the first substrate 200. In some embodiments, the shape of the grid pattern of the grid part 208M is the same as the shape of the grid pattern of the first metal pattern layer 202A. In some embodiments, the size of the grid pattern of the grid part 208M is the same as the size of the grid pattern of the first metal pattern layer 202A.

Similarly, the orthographic projection of the grid part of the second wiring layer on the second substrate 204 is located within the orthographic projection of the second metal pattern layer 206 on the second substrate 204. In some embodiments, the shape of the grid pattern of the grid part of the second wiring layer is the same as the shape of the grid pattern of the second metal pattern layer 206. In some embodiments, the size of the grid pattern of the grid part of the second wiring layer is the same as the size of the grid pattern of the second metal pattern layer 206.

Referring to FIG. 4A and FIG. 4C, the first wiring layer 208 is disposed on the first substrate 200, the first insulating layer 209 is disposed on the first wiring layer 208, the first transparent electrode layer 201A is disposed on the first insulating layer 209, the first metal pattern layer 202A is electrically connected to the first wiring layer 208 via a through hole V extending through the first transparent electrode layer 201A and the first insulating layer 209, and the first transparent conductive pattern layer 203A is disposed on the first metal pattern layer 202A and covers the upper surface and the side surface of the first metal pattern layer 202A. In the normal line of the first substrate 200, the first metal pattern layer 202A overlaps with the first wiring layer 208.

Similarly, the second wiring layer is disposed on the second substrate 204, the second insulating layer is disposed on the second wiring layer, the second transparent electrode layer 205 is disposed on the second insulating layer, the second metal pattern layer 206 is electrically connected to the second wiring layer via a through hole extending through the second transparent electrode layer 205 and the second insulating layer, and the second transparent conductive pattern layer 207 is disposed on the second metal pattern layer 206 and covers the upper surface and the side surface of the second metal pattern layer 206. In the normal line of the second substrate 204, the second metal pattern layer 206 overlaps with the second wiring layer.

In some embodiments, the materials of the first wiring layer 208 and the second wiring layer may include a metal with good electrical conductivity, such as aluminum, molybdenum, titanium, copper, silver, and other metals. In addition, the material of the first insulating layer 209 and the second insulating layer may be an inorganic insulating material, an organic insulating material, or a combination thereof. The inorganic insulating material may be silicon oxide, silicon nitride, silicon oxynitride, etc., and the organic insulating material may be polymethylmethacrylate (PMMA), siloxane, polyimide (PI), epoxy, or other suitable materials. In some embodiments, the first wiring layer 208, the first insulating layer 209, the second wiring layer and the second insulating layer may be formed by a deposition process, an inkjet process, a printing process, a coating process, a photolithography process and/or other appropriate processes.

In summary, in at least one embodiment of the display device of the present disclosure, the display device includes the switch panel disposed under the display panel. The switch panel includes the transparent electrode layer, the metal pattern layer, and the transparent conductive pattern layer sequentially disposed on the substrate. The grain size of the transparent conductive pattern is less than the grain size of the transparent electrode layer. By disposing the metal pattern layer and the transparent conductive pattern layer, the resistance is reduced to increase the switching speed between the light transmitting mode and the opaque mode. Furthermore, through the metal pattern layer and the transparent conductive pattern layer with openings in to expose the transparent electrode layer, the transmittance of the light transmitting mode can be maintained or increased, thereby improving the display quality of the display device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A display device, comprising:

a display panel, having a display surface and a bottom surface opposite to the display surface; and a switch panel, wherein the bottom surface is located between the display surface and the switch panel, and the switch panel comprises:

a first substrate;

a first transparent electrode layer, disposed on the first substrate, and having a first grain size;

a first metal pattern layer, disposed on the first transparent electrode layer, and comprising a plurality of first openings exposing the first transparent electrode layer;

a first transparent conductive pattern layer, covering the first metal pattern layer, comprising a plurality of second openings exposing the first transparent electrode layer, and having a second grain size less than the first grain size;

a second substrate; and a display medium, disposed between the first substrate and the second substrate.

2. The display device of claim 1, wherein the switch panel further comprises:

a second transparent electrode layer, disposed on the second substrate, and having a third grain size;

a second metal pattern layer, disposed on the second transparent electrode layer, and comprising a plurality of third openings exposing the second transparent electrode layer; and a second transparent conductive pattern layer, covering the second metal pattern layer, comprising a plurality of fourth openings exposing the second transparent electrode layer, and having a fourth grain size less than the third grain size.

3. The display device of claim 2, wherein the first grain size and the third grain size are both in a range from 45 nm to 55 nm, wherein the second grain size and the fourth grain size are both in a range from 30 nm to 40 nm.

4. The display device of claim 2, wherein in a normal line of the first substrate, a portion of the first metal pattern layer does not overlap with the second metal pattern layer.

5. The display device of claim 2, wherein the first metal pattern layer comprises a first oxide layer in contact with the first transparent conductive pattern layer, and the second metal pattern layer comprises a second oxide layer in contact with the second transparent conductive pattern layer, wherein a thickness of the first oxide layer and a thickness of the second oxide layer are both less than 5 nm.

6. The display device of claim 2, wherein the first transparent conductive pattern layer covers an upper surface and a side surface of the first metal pattern layer, wherein the second transparent conductive pattern layer covers an upper surface and a side surface of the second metal pattern layer.

7. The display device of claim 2, wherein a transmittance of the first transparent electrode layer and a transmittance of the second transparent electrode layer are greater than a transmittance of the first transparent conductive pattern layer and a transmittance of the second transparent conductive pattern layer, respectively.

8. The display device of claim 7, wherein the transmittance of the first transparent electrode layer and the transmittance of the second transparent electrode layer are both greater than 95%, wherein the transmittance of the first transparent conductive pattern layer and the transmittance of the second transparent conductive pattern layer are both less than 95%.

9. The display device of claim 2, wherein a sheet resistance of the first transparent conductive pattern layer and a sheet resistance of the second transparent conductive pattern layer are less than a sheet resistance of the first transparent electrode layer and a sheet resistance of the second transparent electrode layer, respectively.

10. The display device of claim 9, wherein the sheet resistance of the first transparent conductive pattern layer and the sheet resistance of the second transparent conductive pattern layer are both less than 25Ω/□, wherein the sheet resistance of the first transparent electrode layer and the sheet resistance of the second transparent electrode layer are both greater than 25Ω/58 .

11. The display device of claim 2, wherein an annealing temperature of the first transparent electrode layer and an annealing temperature of the second transparent electrode layer are greater than an annealing temperature of the first transparent conductive pattern layer and an annealing temperature of the second transparent conductive pattern layer, respectively.

12. The display device of claim 11, wherein the annealing temperature of the first transparent electrode layer and the annealing temperature of the second transparent electrode layer are both greater than 400 °C, wherein the annealing temperature of the first transparent conductive pattern layer and the annealing temperature of the second transparent conductive pattern layer are both less than 300 °C.

13. The display device of claim 2, wherein a orthographic projection of the first metal pattern layer on the first substrate is located within a orthographic projection of the first transparent conductive pattern layer on the first substrate, wherein a orthographic projection of the second metal pattern layer on the second substrate is located within a orthographic projection of the second transparent conductive pattern layer on the second substrate.

14. The display device of claim 2, wherein a orthographic projection of the second opening on the first substrate is located within a orthographic projection of the first opening on the first substrate, wherein a orthographic projection of the fourth opening on the second substrate is located within a orthographic projection of the third opening on the second substrate.

15. The display device of claim 1, wherein the first transparent electrode layer comprises a plurality of transparent electrodes separated from each other, and the first metal pattern layer and the first transparent conductive pattern layer comprises a plurality of grid patterns separated from each other, respectively.

16. The display device of claim 15, wherein the switch panel further comprises:

a firs wiring layer, disposed on the first substrate;

a first insulating layer, disposed on the firs wiring layer, wherein the first transparent electrode layer is disposed on the first insulating layer; and a through hole, extending through the first transparent electrode layer and the first insulating layer, wherein the first metal pattern layer is electrically connected to the first wiring layer through the through hole.

17. The display device of claim 16, wherein in a normal line of the first substrate, the first wiring layer overlaps with the first metal pattern layer.

18. A display device, comprising:

a transparent display panel, having a display surface and a bottom surface opposite to the display surface; and a switch panel, wherein the bottom surface is located between the display surface and the switch panel, and the switch panel comprises:

a first substrate;

a first transparent electrode layer, disposed on the first substrate, and having a first grain size;

a first metal pattern layer, disposed on the first transparent electrode layer, and comprising a plurality of first openings exposing the first transparent electrode layer;

a first transparent conductive pattern layer, covering the first metal pattern layer, comprising a plurality of second openings exposing the first transparent electrode layer, and having a second grain size less than the first grain size;

a second substrate; and a display medium, disposed between the first substrate and the second substrate.

19. The display device of claim 18, wherein the transparent display panel is a micro light emitting diode panel or an organic light emitting diode panel.

20. The display device of claim 18, wherein the display medium comprises a suspended particle layer, a polymer dispersed liquid crystal layer, or an electrochromic material layer.

* * * * *